US008427347B1

(12) United States Patent
Chai et al.

(10) Patent No.: US 8,427,347 B1
(45) Date of Patent: Apr. 23, 2013

(54) DYNAMIC DATA COMPRESSION AND DECOMPRESSION

(75) Inventors: Chung Shien Chai, Georgetown (MY); Yin Chong Hew, Selama (MY)

(73) Assignee: Altera Corporation, San Jose, CA (US)

( * ) Notice: Subject to any disclaimer, the term of this patent is extended or adjusted under 35 U.S.C. 154(b) by 114 days.

(21) Appl. No.: 13/075,656

(22) Filed: Mar. 30, 2011

(51) Int. Cl.
*H03M 7/38* (2006.01)

(52) U.S. Cl.
USPC .............................................. 341/51; 341/59

(58) Field of Classification Search .................... 341/50, 341/51, 59, 63, 65, 67, 106
See application file for complete search history.

(56) References Cited

U.S. PATENT DOCUMENTS

| | | | |
|---|---|---|---|
| 5,838,264 A | 11/1998 | Cooper | |
| 5,841,381 A | 11/1998 | Nakayama | |
| 6,885,319 B2 * | 4/2005 | Geiger et al. | 341/51 |
| 7,460,032 B2 * | 12/2008 | Boldt et al. | 341/50 |
| 7,719,443 B1 * | 5/2010 | Natanzon | 341/51 |
| 8,044,829 B2 * | 10/2011 | Chen et al. | 341/51 |

OTHER PUBLICATIONS

"Chapter 1: Stratix IV Transceiver Architecture," Stratix IV Device Handbook, Mar. 2010, p. 1-1-1-226, vol. 2, Altera Corporation, San Jose, CA.
"Chapter 5: Device Configuration Options," Configuration Handbook, Dec. 2009, p. 5-1-5-8, Altera Corporation, San Jose, CA.
"Chapter 8: Configuration and Remote System Upgrades in Cyclone IV Devices," Cyclone IV Device Handbook, Jul. 2010, p. 8-1-8-80, vol. 1, Altera Corporation, San Jose, CA.
"Chapter 10: Configuration, Design Security, and Remote System Upgrades in Stratix IV Devices," Stratix IV Device Handbook, Mar. 2010, p. 10-1-10-68, vol. 1, Altera Corporation, San Jose, CA.
"Chapter 11: Configuring Stratix & Stratix GX Devices," Stratix Device Handbook, Jul. 2005, p. 11-1-11-60, Altera Corporation, San Jose, CA.
"Chapter 11: Configuring Stratix III Devices," Stratix III Device Handbook, vol. 1, Jul. 2010, p. 11-1-11-50, Altera Corporation, San Jose, CA.
Lattice ECP/EC Family Handbook, Jun. 2004, p. 1-231, Lattice Semiconductor Corporation.
LatticeSC Forums—Bitstream Compression, http://www.latticesemi.com/, Mar. 2008, p. 1-4.

(Continued)

*Primary Examiner* — Peguy Jean Pierre
(74) *Attorney, Agent, or Firm* — Mauriel Kapouytian & Treffert LLP; Avavat Kapouytian

(57) ABSTRACT

A method of compressing data is provided. In one implementation, the method includes compressing data with a plurality of compression schemes, where the compressing is computer implemented. Also, in one implementation, the plurality of compression schemes include a first compression scheme and a second compression scheme and the compressing includes compressing a first portion of the data with the first compression scheme and compressing a second portion of the data with the second compression scheme, where the second compression scheme is different from the first compression scheme. In one implementation, the method further includes determining a suitable compression scheme from the plurality of compression schemes with which to compress each portion of the data, where the determining is computer implemented. In one implementation, the data is configuration data for configuring an IC.

20 Claims, 12 Drawing Sheets

OTHER PUBLICATIONS

"Configuring Altera FPGAs", Configuration Handbook, 2008, p. 1-1-1-10, vol. 1, Altera Corporation, San Jose, CA.

Khu, Arthur, "Xilinx FPGA Configuration Data Compression and Decompression," White Paper: Configuration Solutions, Sep. 25, 2001, p. 1-4, Xilinx, Inc.

"Low-Cost FPGA Configuration Via Industry-Standard SPI Serial Flash & Lattice ECP/EC FPGAs," A Lattice Semiconductor White Paper, Jun. 2004, p. 1-13, Hillsboro, Oregon.

Parallel Flash Loader Megafunction User Guide, Feb. 2011, p. 1-61, Altera Corporation, San Jose, CA.

Ramly, Noor Hazlina, et al. "Double Compression Solution Using Configuration Controller with Decompression Feature for Optimized Configuration File Size," 2009, Altera Corp.

Tan, Tze Sin, Compressing Configuration Data of High Density FPGA Using Huffman Coding, p. 1-6, 2008, Altera Corporation, Penang, Malaysia.

Ziv, Jacob et al., "A Universal Algorithm for Sequential Data Compression", IEEE Transactions on Information Theory, May 1977, p. 337-343, vol. IT-23, No. 3.

* cited by examiner

US 8,427,347 B1

DYNAMIC DATA COMPRESSION AND DECOMPRESSION

BACKGROUND

Programmable integrated circuits (ICs) include at least a portion that is programmable. Examples of programmable ICs include programmable logic devices (PLDs) (also sometimes referred to as complex PLDs (CPLDs), programmable array logic (PALs), programmable logic arrays (PLAs), field PLAs (FPLAs), erasable PLDs (EPLDs), electrically erasable PLDs (EEPLDs), logic cell arrays (LCAs), field programmable gate arrays (FPGAs), or by other names). Application specific integrated circuits (ASICs) have traditionally been fixed ICs. However, it is possible to provide an ASIC that has a portion or portions that are programmable. Thus, it is possible for an IC device to have qualities of both an ASIC and a PLD. The term PLD as used herein will be considered broad enough to include such devices.

The data for configuring the programmable IC is sometimes referred to as configuration data. In some cases, the size of the configuration data is reduced using data compression. The compression of the configuration data allows for using smaller memories for storing the data. Examples of compression schemes include nibble-aligned groups of zeros scheme (Z-N scheme), group of zeros scheme (ZERO scheme), group of ones scheme (ONE scheme), group of zeros with last byte ended with a variable scheme (Z-S-V scheme), group of zeros with last two bytes ended with a variable scheme (Z-D-V scheme), group of same variable scheme (VAR scheme), repetitive set of multiple variable scheme (M-VAR scheme), Lempel-Ziv scheme (LZ77 scheme), and Lempel-Ziv-Welch scheme (LZW scheme). Each of these compression schemes has a corresponding decompression scheme.

In existing configuration data compression methods, only one data compression scheme is applied to the configuration data.

SUMMARY

In one aspect, an embodiment of the present invention provides a method including compressing data with a plurality of compression schemes, where the compressing is computer implemented. In one embodiment, the plurality of compression schemes includes a first compression scheme and a second compression scheme and the compressing includes compressing a first portion of the data with the first compression scheme and compressing a second portion of the data with the second compression scheme, where the second compression scheme is different from the first compression scheme. In one embodiment, the method further includes determining a suitable compression scheme from the plurality of compression schemes with which to compress each portion of the data, where the determining is computer implemented. In one embodiment, the data is configuration data for configuring an IC.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
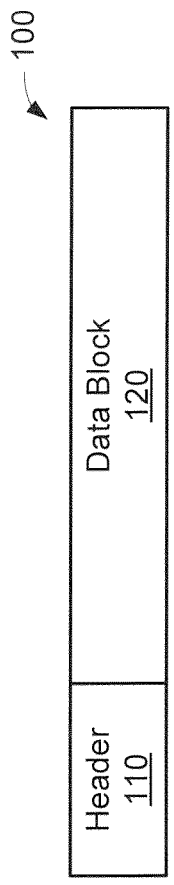
FIG. 1 is a top level structure of one embodiment of a compressed data frame of the present invention.

FIG. 1 is a top level structure of one embodiment of a compressed data frame of the present invention. In FIG. 1, compressed data frame 100 includes header 110 and data block 120. In one embodiment, header 110 is N bytes long, where N is an integer greater than or equal to 1. Also, in one embodiment, frame 120 is M bytes long, where M is an integer greater than or equal to 1. In one embodiment, data block 120 may represent the compressed data compressed using an embodiment of the method of the present invention. In another embodiment, data block 120 may represent one or more variables compressed using an embodiment of the method of the present invention. This may be the case, for example, when the uncompressed data contains a group of the same variable or a group of multiple variables. In yet another embodiment, data block 120 may represent uncompressed data. This may be the case, for example, when it is determined, based on an embodiment of the method of the present invention, that the uncompressed data does not contain a recognizable data pattern.

Figure 2:
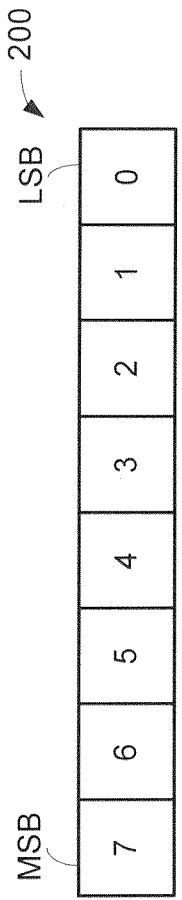
FIG. 2 is detailed diagram of one embodiment of a header of a compressed data frame of the present invention.

FIG. 2 is detailed diagram of one embodiment of a header of a compressed data frame of the present invention. In FIG. 2, header 200 is one byte long. In other words, for header 200, N is equal to 1. As such, header 200 includes 8 bits from a least significant bit (LSB), which is designated as bit 0 in FIG. 2, to a most significant bit (MSB) which is designated as bit 7 in FIG. 2. The MSB bit, bit 7, is also referred to as a header size bit and reflects the size of header 200. In one embodiment, a 0 bit value stored in the MSB bit indicates that the header is a one byte header (i.e., N is equal to 1 for the header) and a 1 bit value stored in the MSB bit indicates that the header is a two byte header (i.e., N is equal to 2 for the header). In the embodiment shown in FIG. 2, as header 200 is a one byte header, its MSB bit stores a 0 bit value. In one embodiment, bits 6 to 4 indicate the compression scheme used and bits 3 to 0 indicate the data length of the uncompressed data (in bytes). More specifically, in one embodiment, the value stored in bits 3 to 0 represents the data length−1. In other words, a value of 0 stored in bits 3 to 0 indicates that the data length is 1 byte long. On the other hand, a value of 15 stored in bits 3 to 0 indicates that the data length is 16 bytes long. In another embodiment, instead of representing the data length, bits 3 to 0 indicate the multi-variable size and multi-variable data length. More specifically, bits 3 to 2 indicate the multi-variable size and bits 1 to 0 indicate the multi-variable data length. It is to be noted that, in one embodiment, bits 3 to 0 indicate the multi-variable size and multi-variable data length when the compression scheme is the M-VAR scheme. In one embodiment, the value stored in bits 3 to 2 represents the multi-variable size−1 and the value stored in bits 1 to 0 represents the multi-variable data length−1.

Figure 3:
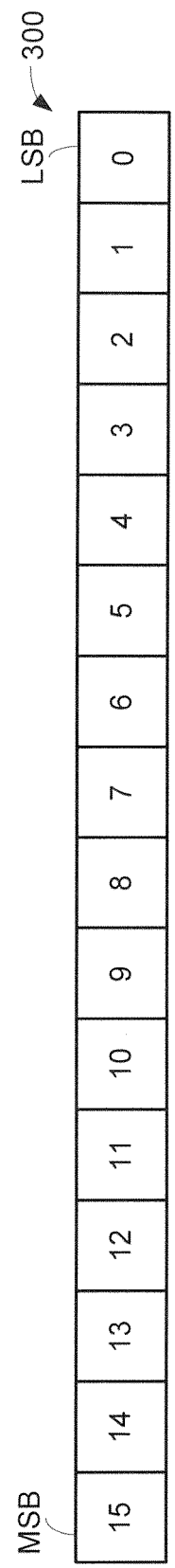
FIG. 3 is detailed diagram of another embodiment of a header of a compressed data frame of the present invention.

FIG. 3 is detailed diagram of another embodiment of a header of a compressed data frame of the present invention. In FIG. 3, header 300 is two bytes long. In other words, for header 300, N is equal to 2. As such, header 300 includes 16 bits from an LSB, which is designated as bit 0 in FIG. 3, to an MSB which is designated as bit 15 in FIG. 3. The MSB bit, bit 15, is also referred to as a header size bit and reflects the size of header 300. In one embodiment, a 0 bit value stored in the MSB bit indicates that the header is a one byte header (i.e., N is equal to 1 for the header) and a 1 bit value stored in the MSB bit indicates that the header is a two byte header (i.e., N is equal to 2 for the header). In the embodiment shown in FIG. 3, as header 300 is a two byte header, its MSB bit stores a 1 bit value. In one embodiment, bits 14 to 12 indicate the compression scheme used and bits 11 to 0 indicate the data length of the uncompressed data (in bytes). More specifically, in one embodiment, the value stored in bits 11 to 0 represents the data length−1. In other words, a value of 0 stored in bits 11 to 0 indicates that the data length is 1 byte long. On the other hand, a value of $2^{12}-1$ stored in bits 11 to 0 indicates that the data length is $2^{12}$ bytes long. In another embodiment, instead of representing the data length, bits 11 to 0 indicate the multi-variable size and multi-variable data length. More specifically, bits 11 to 6 indicate the multi-variable size and bits 5 to 0 indicate the multi-variable data length. It is to be noted that, in one embodiment, bits 11 to 0 indicate the multi-variable size and multi-variable data length when the compression scheme is the M-VAR scheme. In one embodiment, the value stored in bits 11 to 6 represents the multi-variable size−1 and the value stored in bits 5 to 0 represents the multi-variable data length−1.

Table 1 below summarizes the bit location definitions for headers where N is equal to 1 or 2:

TABLE 1

| Bit Location | | Definition |
|---|---|---|
| N = 1 | N = 2 | |
| Bit 7 | Bit 15 | Determine the size of the frame header, N. b'0: N = 1 byte. b'1: N = 2 bytes. |
| Bits [6:4] | Bits [14:12] | Determine the compression scheme being used. b'000: ZERO scheme b'001: Z-S-V scheme |

TABLE 1-continued

| Bit Location | | Definition |
|---|---|---|
| N = 1 | N = 2 | |
| | | b'010: VAR scheme b'011: M-VAR scheme b'100: Z-N scheme b'101: No or None compression (NONE scheme) b'110: Z-D-V scheme b'111: ONE scheme |
| Bits [3:0] | Bits [11:0] | Determine the original data length for data decompression purposes. The data length can be calculated using the following equation: Data Length ≦ $2^n$, where n is the total bits used to represent the data length. For example, when N = 1, the maximum data length is $2^4$ = 16 bytes. |
| Bits [3:2] | Bits [11:6] | Applicable when the Bits [6:4] or Bits [14:12] is set to b'011 (i.e., when the M-VAR scheme is the compression scheme used). Determine the variable size. The variable size can be calculated using the following equation: Variable Size ≦ $2^n$, where n is the total bits used to represent the variable size. |
| Bits [1:0] | Bits [5:0] | Applicable when the Bits [6:4] or Bits [14:12] is set to b'011 (i.e., when the M-VAR scheme is the compression scheme used). Determine the variable length. The variable length can be calculated using the following equation: Variable Length ≦ $2^n$, where n is the total bits used to represent the variable length. |

It is to be noted that in Table 1 above, the notation b' indicates binary bit values. For example, b'1 indicates a binary 1 value and b'011 indicates a binary 011 value.

In the embodiments of headers described above, one bit is used to represent the header size. In an alternative embodiment, a different number of bits may be used to represent the header size. More generally, x bits may be used to represent header size, where x is an integer greater than or equal to 1. In such a case, there may be $2^x$ header options available. Similarly, in the embodiments of headers described above, three bits are used to represent the compression scheme. In an alternative embodiment, a different number of bits may be used to represent the compression scheme. More generally, y bits may be used to represent the compression scheme, where y is an integer greater than or equal to 1. In such a case, there may be $2^y$ compression schemes available. Similar generalizations may be made for the data length, the multi-variable size, and the multi-variable data length. Also, in an alternative embodiment, there may be a correspondence different from that shown in Table 1 between the compression scheme bits and the compression schemes and between the header size bit and the header size.

Table 2 below sets forth examples of data patterns, as well as examples of uncompressed data having those data patterns and the corresponding compressed data:

TABLE 2

| Data Pattern | Example Data (U) and (C) in HEX Format |
|---|---|
| Group of zeros | (U): 00 00 00 00 00 . . . 00 00 00 00 00 Assume continuous 4000 bytes of zero. (C): 8F 9F Compression scheme: ZERO scheme Frame header size, N = 2 since the original data length is 4000 bytes, where |

TABLE 2-continued

| Data Pattern | Example Data (U) and (C) in HEX Format |
|---|---|
| | Bit 15 = b'1 <br> Bits [14:12] = b'000 <br> Bits [11:0] = b'1111 1001 1111 (data length − 1) <br> Data block is empty. |
| Group of zeros with last byte ended with variable | (U): 00 00 00 00 00 00 00 00 00 00 6A <br> (C): 19 6A <br> Compression scheme: Z-S-V scheme <br> Frame header: 19 <br> Bit 7 = b'0 <br> Bits [6:4] = b'001 <br> Bits [3:0] = b'1001 (data length − 1) <br> Data block: 6A |
| Group of zeros with last two bytes ended with variables | (U): 00 00 00 00 00 00 00 00 00 7B 8C <br> (C): 69 7B 8C <br> Compression scheme: Z-D-V scheme <br> Frame header: 69 <br> Bit 7 = b'0 <br> Bits [6:4] = b'110 <br> Bits [3:0]= b'1001 (data length − 1) <br> Data block: 7B 8C |
| Group of same variable | (U): EF EF EF EF EF EF EF EF EF EF EF <br> (C): 2A EF <br> Compression scheme: VAR scheme <br> Frame header: 2A <br> Bit 7 = b'0 <br> Bits [6:4] = b'010 <br> Bits [3:0] = b'1010 (data length − 1) <br> Data block: EF |
| Repetitive set of multiple variables | (U): AB AB AB AB 08 08 08 08 6C 6C 6C 6C <br> (C): 3B AB 08 6C <br> Compression scheme: M-VAR scheme <br> Variable size = 3 (AB, 08, and 6C) <br> Variable length = 4 (each variable has repeated 4 times) <br> Frame header: 3B <br> Bit 7 = b'0 (variable size ≤4 and variable length ≤4) <br> Bits [6:4] = b'011 <br> Bits [3:2] = b'10 (variable size − 1) <br> Bits [1:0] = b'11 (variable length − 1) <br> Data block: AB 08 6C |
| Nibble-aligned group of zeros | (U): 0A C0 00 00 90 30 00 E0 0A 00 00 C0 00 10 70 06 <br> (C): 4F 09 8A 81 68 AC 93 EA C1 76 <br> Compression scheme: Z-N scheme <br> Frame header: 4F <br> Bit 7 = b'0 <br> Bits [6:4] = b'100 <br> Bits [3:0] = b'1111 (data length − 1) <br> Every 16 byte of data is represented by 4 byte of nibble information. <br> Nibble information (represent non-zero nibble with b'1): <br> 00 00 C0 0A → b'0000 1001 (0x09) <br> E0 00 30 90 → b'1000 1010 (0x8A) <br> C0 00 00 0A → b'1000 0001 (0x81) <br> 06 70 10 00 → b'0110 1000 (0x68) <br> Note that, in the above example, in the uncompressed data stream (U), data is received from left to right as appears on the page. In other words, the byte 0A in (U) is the first byte received (and is the least significant byte) and the byte 06 in (U) is the last byte received (and is the most significant byte). For Nibble Information determination, in the above example, for each four bytes of data from (U), the uncompressed data is shown from the least significant byte to the most significant byte from left to right on the page. For example, the first four bytes of data from the uncompressed data 0A C0 00 00 are displayed as 00 00 C0 0A. On the other hand, in the above example, the Nibble Information, for each group of four bytes of uncompressed data, is shown such that the most significant nibble is on the left of the page and the least significant nibble is on the right of the page. However, below, the Nibble Information for each group of four bytes of data is ordered such that Nibble Information for the least significant group of four bytes is on the left of the page and the Nibble Information for the most significant group of four bytes is on the right of the page. <br> Non-zero nibble: AC 93 EA C1 76 <br> Data block: 09 8A 81 68 AC 93 EA C1 76 |
| Non-compressed data | (U): 91 63 CD 69 0A EF C2 35 30 44 EF 89 E2 D1 CD 79 58 23 7A 67 8A EE 1D 83 12 65 89 5E 75 DC 4A 7B 96 51 08 29 42 <br> Not recognizable data pattern <br> (C): D0 24 91 63 CD 69 0A EF C2 35 30 44 EF 89 E2 D1 CD 79 58 23 7A 67 8A EE 1D 83 12 65 89 5E 75 DC 4A 7B 96 51 08 29 42 <br> Compression scheme: NONE scheme <br> Frame header: D0 24 <br> Bit 15 = b'1 <br> Bits [14:12] = b'101 <br> Bits [11:0] = b'0000 0010 0100 (data length − 1) <br> Data block: 91 63 . . . 29 42 (original data) |
| Group of ones | (U): FF FF FF FF FF . . . FF FF FF FF FF <br> Assume continuous 3000 bytes of 0xFF. <br> (C): FB B7 <br> Compression scheme: ONE scheme <br> Frame header: <br> Bit 15 = b'1 <br> Bits [14:12] = b'111 <br> Bits [11:0] = b'1011 1011 0111 (data length − 1) <br> Data block is empty. |

In Table 2 above, (U) and (C) respectively indicate uncompressed and compressed data. The uncompressed and compressed data are represented in hexadecimal format in Table 2. The compressed data (C) represents the data in the compressed frame, i.e., the information in the frame header and the data block of a compressed frame. In Table 2, unlike (U), (C), and the frame header, the subcomponents of the frame header are represented in binary format as they are preceded by b'. In the nibble-aligned group of zeros block of Table 2, each nibble (i.e., four bits) is either replaced with a 0 bit value or a 1 bit value. A zero nibble is replaced with a 0 bit value, whereas a non-zero nibble is replaced with a 1 bit value. For example, for the uncompressed group of four bytes of data 90 30 00 E0 (where 90 is the least significant byte in the group and E0 is the most significant byte in the group) the Nibble Information (NI) is determined to be 10 00 10 10 which is also represented as 0x8A (where 0x indicates a hexadecimal format, 8 is the hexadecimal representation of binary 10 00, and A is the hexadecimal representation of binary 10 10). In NI 0x8A, 8 is the most significant nibble and A is the least significant nibble. Finally, as indicated in Table 2, in some cases, for example, group of ones and group of zeros, the data block is empty.

In Table 2, the nibble-aligned group of zeros uncompressed data (U) includes 16 bytes of data 0A C0 00 00 93 00 00 E0 0A 00 00 C0 00 10 70 06. In one embodiment, for nibble-aligned group of zeros, each frame of data is further divided into sub-frames of data, where each sub-frame includes up to 16 bytes of data. In the above example, as the uncompressed data (U) includes 16 bytes of data it represents both a frame and a sub-frame of data.

In another example, however, the frame of uncompressed data may include more than one sub-frame of uncompressed data. For example, the uncompressed data (U) 0A 00 00 B0 00 7A 03 00 00 15 01 15 00 00 10 20 00 03 00 40 9B 00 00 C0 00 EF 00 00 C0 C0 E0 00 00 02 09 B0 includes 36 bytes of data which are divided into three sub-frames of data. The first sub-frame includes 0A 00 00 B0 00 7A 03 00 00 15 01 15 00 00 10 20, the second sub-frame includes 00 03 00 40 9B 00 00 C0 00 EF 00 00 C0 C0 E0 00, and the third sub-frame includes 00 02 09 B0.

Each of these sub-frames has its own NI. The first sub-frame 0A 00 00 B0 00 7A 03 00 00 15 01 15 00 00 10 20 includes four groups of four-byte-long data 0A 00 00 B0, 00 7A 03 00, 00 15 01 15, and 00 00 10 20. The first group is 0A 00 00 B0 (with the least significant byte on the left of the page and the most significant byte on the right of the page) and is represented by NI b'10 00 00 01 (0x81), the second group is 00 7A 03 00 (with the least significant byte on the left of the page and the most significant byte on the right of the page) and is represented by NI b'00 01 11 00 (0x1C), the third group is 00 15 01 15 (with the least significant byte on the left of the page and the most significant byte on the right of the page) and is represented by NI b'11 01 11 00 (0xDC), and the fourth group is 00 00 10 20 (with the least significant byte on the left of the page and the most significant byte on the right of the page) and represented by NI b'10 10 00 00 (0xA0). Thus, the overall NI for the first sub-frame is 81 1C DC A0. The non-zero data is AB 7A 31 51 15 12. The overall compressed data for the first sub-frame is 81 1C DC A0 AB 7A 31 51 15 12.

The second sub-frame 00 03 00 40 9B 00 00 C0 0.00 EF 00 00 C0 C0 E0 00 includes four groups of four-byte-long data 00 03 00 40, 9B 00 00 C0, 00 EF 00 00, and C0 C0 E0 00. The first group is 00 03 00 40 (with the least significant byte on the left of the page and the most significant byte on the right of the page) and is represented by NI b'10 00 01 00 (0x84), the second group is 9B 00 00 C0 (with the least significant byte on the left of the page and the most significant byte on the right of the page) and is represented by NI b'10 00 00 11 (0x83), the third group is 00 EF 00 00 (with the least significant byte on the left of the page and the most significant byte on the right of the page) and is represented by NI b'00 00 11 00 (0x0C), and the fourth group is C0 C0 E0 00 (with the least significant byte on the left of the page and the most significant byte on the right of the page) and is represented by NI b'00 10 10 10 (0x2A). Thus, the overall NI for the second sub-frame is 84 83 0 C 2A. The non-zero data is 34 9B CE FC CE. The overall compressed data for the second sub-frame is 84 83 0C 2A 34 9B CE FC CE.

The third sub-frame 00 02 09 B0 includes one group of four-byte-long data 00 02 09 B0. The data is 00 02 09 B0 (with the least significant byte on the left of the page and the most significant byte on the right of the page) and is represented by NI b'10 01 01 00 (0x94). Thus, the overall NI for the third sub-frame is 94. The non-zero data is 29 B. Since, in one embodiment, data is processed in byte(s), an additional nibble of data is appended after B to complete two bytes of data. In one embodiment, a nibble of all zeros is added to the non-zero data, which results in a non-zero data of 29 B0. The overall compressed data for the third sub-frame is 94 29 B0.

In the above example, as the uncompressed data is 36 bytes long, a double header is used. The header for the uncompressed data is b'1100 0000 0010 0011 (0xC0 0x23). In the above header, Bit 15 is 1 and indicates that the header is a double header, Bits [14:12] are 100 and indicate that the compression scheme is the Z-N scheme, and Bits [11:0] are 0000 0010 0011 and indicate that the uncompressed data is 36 bytes long. Also, in the above example, the final compressed data is made up of the header data of C0 23 and overall compressed data for sub-frames one to three in that order, where as noted above the overall compressed data for each sub-frame includes the NI for the sub-frame followed by the non-zero nibble data for that sub-frame. The overall compressed data for the first sub-frame is 81 1C DC A0 AB 7A 31 51 15 12, the overall compressed data for the second sub-frame is 84 83 0C 2A 34 9B CE FC CE, and the overall compressed data for the third sub-frame is 94 29 B0. Thus, the overall compressed data (including the header) for the entire frame is C0 23 811CDCA0 AB 7A 31 51 15 12 84830C2A 34 9B CE FC CE 94 29 B0, where the underlined portions indicate the NI for the sub-frames of the uncompressed data.

Subdividing the frames into sub-frames allows for better management of resources during the decompression process by setting an upper limit on the storage size to be used for storing NI during the decompression process. For example, in the above example, as the sub-frame is up to 16 bytes long, the NI for the sub-frame is up to 4 bytes long. This places a known upper limit on the size of the storage needed for storing the NI during decompression. Additionally, subdividing the frames into sub-frames also allows for using a smaller storage for storing the NI during the decompression process. For example, without the use of sub-frames, the above 36 bytes of uncompressed data would have an NI that is 9 bytes long. As such, 9 bytes of storage would be needed for storing the NI during decompression. For larger uncompressed data an even larger storage would be required for storing the NI during decompression. On the other hand, in the above example with sub-frames, a storage of 4 bytes would be used for storing the NI regardless of length of the uncompressed data. The 4 bytes of storage is reused for storing, in sequential order, the NI of each of the sub-frames.

Figure 4:
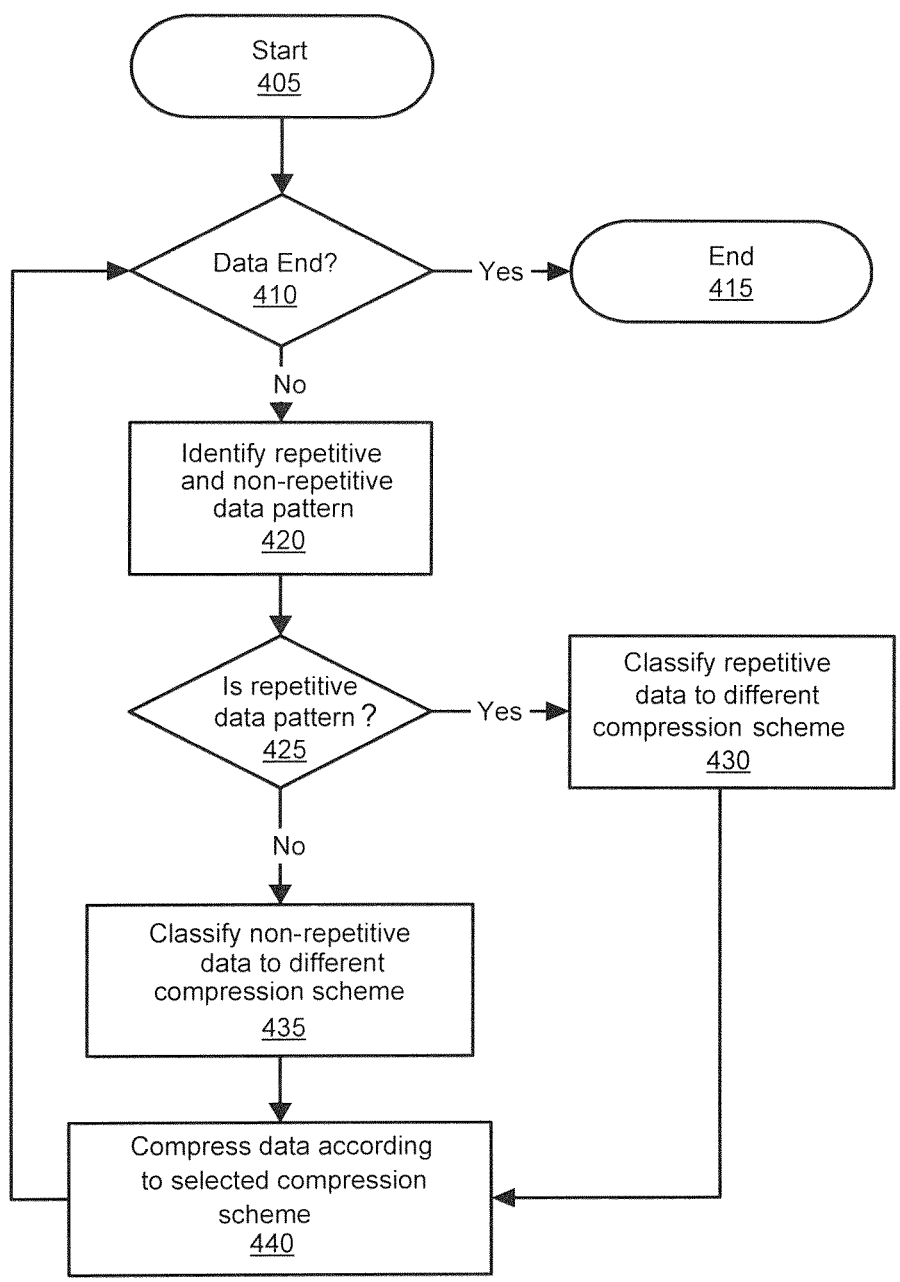
FIG. 4 is a flowchart illustrating one embodiment of a data compression method of the present invention.

FIG. 4 is a flowchart illustrating one embodiment of a data compression method of the present invention. Compression method 400 starts at 405 and, in one embodiment, involves compressing one portion of data at a time, where the portions of the data being compressed may be of different patterns and sizes. At 410, it is determined whether the end of the data to be compressed has been reached. In a specific embodiment, it is determined whether the portion of data that was last compressed represents the end of the data. If the answer at 410 is yes, then the compression process ends at 415. However, if the answer at 410 is no, then the compression process proceeds to 420. At 420, portions of the data to be compressed are identified as repetitive or non-repetitive data patterns. In one embodiment, repetitive data patterns include a group of zeros, a group of ones, a repetitive set of multiple variables, and a group of the same variable. Also, in one embodiment, non-repetitive data patterns include a group of zeros with a last byte ended with a variable, a group of zeros with the last two bytes ended with variables, a nibble-aligned group of zeros, and a non-recognizable data pattern (which, in one embodiment, is not compressed). More specifically, in one embodiment, at 420, a portion of data to be compressed is identified as repetitive or non-repetitive data pattern. At 425, it is determined whether the data portion is a repetitive data pattern. If the answer at 425 is yes, then the process proceeds to 430. At 430, the repetitive data pattern is classified as a particular type of a repetitive data pattern and a corresponding compression scheme is selected for compressing that repetitive data pattern. If the answer at 425 is no, then the process proceeds to 435. At 435, the non-repetitive data pattern is classified as a particular type of a non-repetitive data pattern and a corresponding compression scheme is selected for compressing that non-repetitive data pattern. From both 430 and 435, the process proceeds to 440, where the portion of data is compressed according to the selected compression scheme. As can be seen from FIG. 4, the steps 410 to 440 are repeated until the end of the data is reached, at which point the process ends at 415.

Figure 5:
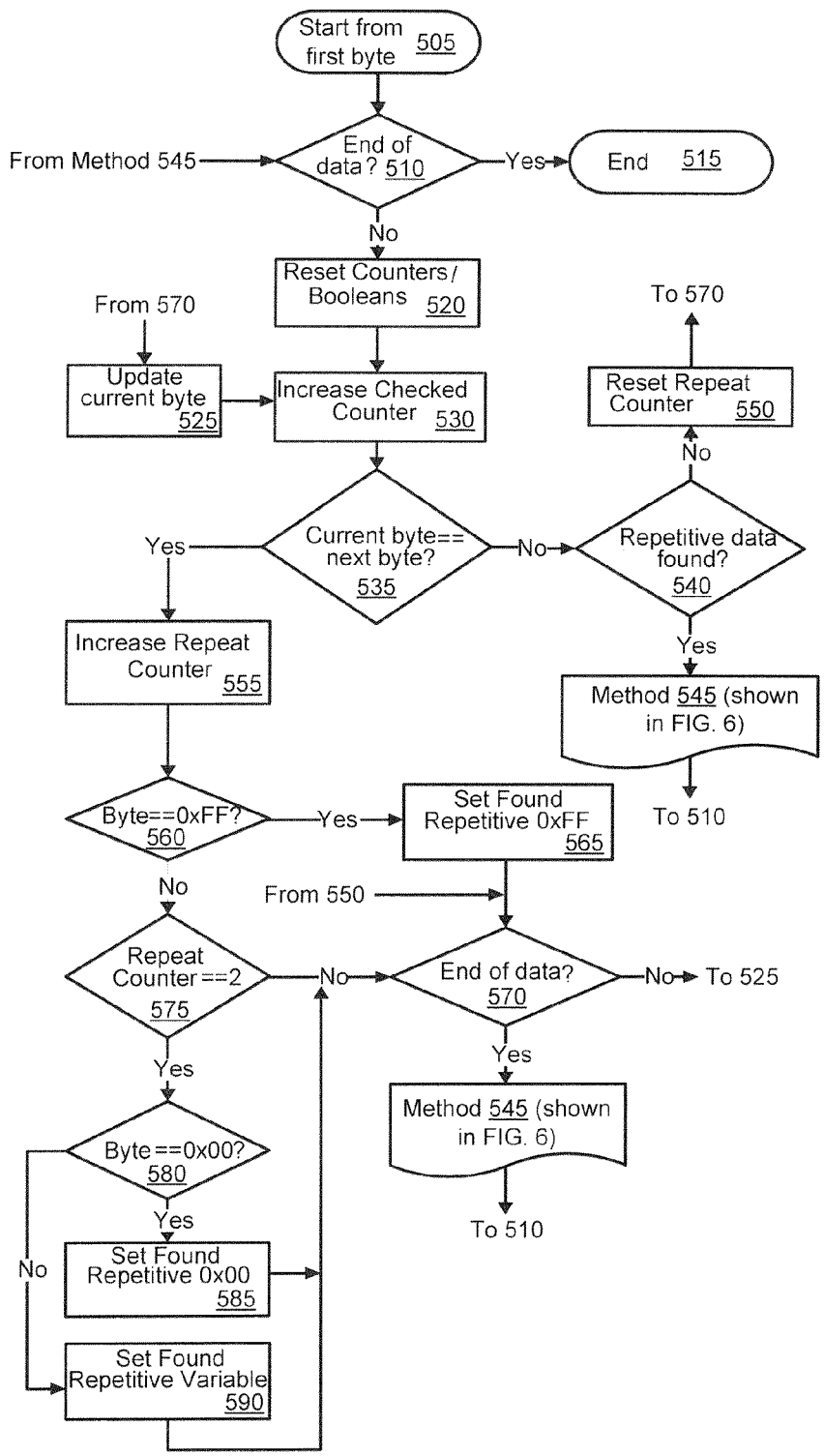
FIG. 5 is a more detailed flowchart illustrating the method of FIG. 4.

FIG. 5 is a more detailed flowchart illustrating the method of FIG. 4. More specifically, FIG. 5 illustrates in more detail the step of identifying repetitive and non-repetitive data patterns 420 of FIG. 4. The process 500 of FIG. 5 begins at 505 with a first byte of data. At 510, it is determined whether the byte of data represents the end of data.

If the answer at 510 is yes, then the process proceeds to 515 which represents the end of the process. If the answer at 510 is no, then the process proceeds to 520.

At 520, the counter values (which may be referred to as counters in the drawings) involved in the method of FIG. 5 are reset to zero and the booleans involved in the method of FIG. 5 are reset to false. From 520 the process proceeds to 530. The process also proceeds to 530 from 525. At 525, the current byte is updated. In other words, the byte immediately after the current byte in the data to be compressed is analyzed. This updated byte is then considered the current byte. At 530, the checked counter value (which may be referred to as the checked counter in the drawings) is increased. In one specific implementation, the checked counter value is incremented by one. From 530, the process proceeds to 535, where it is determined whether the current byte is equal to the next byte, where the next byte is the byte immediately after the current byte.

If the answer at 535 is no, then the process proceeds to 540. At 540, it is determined whether repetitive data is found. More specifically, in one embodiment, it is determined if repetitive data was found during processing of the previous byte. In one embodiment, it is determined if found repetitive data was set at 565, 585, or 590 during processing of the previous byte. If the answer at 540 is yes, then the process proceeds to method 545 (which is shown in greater detail in FIG. 6). After method 545, the process returns to 510. If the answer at 540 is no, then the process proceeds to 550, where the repeat counter value (which may be referred to as the repeat counter in the drawings) is reset to zero. From 550 the process continues at 570.

If the answer at 535 is yes, then from 535 the process proceeds to 555. At 555, the repeat counter value is increased, more specifically, incremented by one. From 555 the process proceeds to 560, where it is determined whether the current byte is equal to 0xFF (where as noted above, 0x indicates hexadecimal notation). In other words, at 560, it is determined whether the current byte is equal to FF in hexadecimal notation (i.e., 1111 1111 in binary notation).

If the answer at 560 is yes, then from 560 the process proceeds to 565. At 565, the variable found repetitive 0xFF is set. From 565 the process proceeds to 570, where it is determined whether the current byte represents the end of data. If the answer at 570 is no, then the process returns to 525. If the answer at 570 is yes, then the process proceeds to method 545 (which is shown in greater detail in FIG. 6). After method 545, the process returns to 510.

If the answer at 560 is no, then from 560 the process proceeds to 575. At 575, it is determined whether the repeat counter value is equal to 2. If the answer at 575 is no, then from 575 the process proceeds to 570. If the answer at 575 is yes, then from 575 the process proceeds to 580. At 580, it is determined whether the current byte is equal to 0x00 (where as noted above, 0x indicates hexadecimal notation). In other words, at 580, it is determined whether the current byte is equal to 00 in hexadecimal notation (i.e., 0000 0000 in binary notation). If the answer at 580 is yes, then from 580 the process proceeds to 585. At 585, the variable repetitive 0x00 (where 0x00 is as defined above) is found is set. If the answer at 580 is no, then from 580 the process proceeds to 590. At 590, the found repetitive variable is set. From 590, the process proceeds to 570. Similarly, from 585, the process proceeds to 570.

Figure 6:
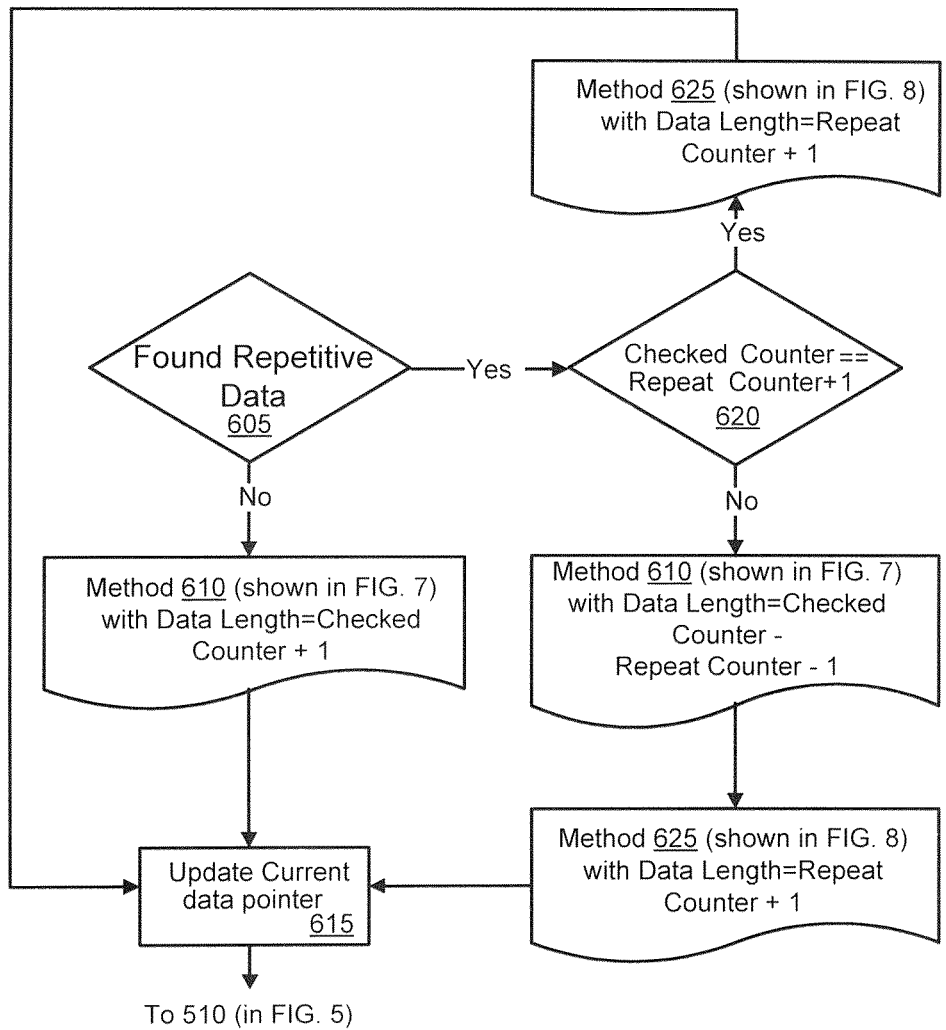
FIG. 6 is a detailed flowchart of a portion of the flowchart shown in FIG. 5.

FIG. 6 is a detailed flowchart of a portion of the flowchart shown in FIG. 5. More specifically, FIG. 6 is a detailed flowchart of method 545 shown in FIG. 5. Method 545 begins at 605, where it is determined whether repetitive data is found.

If the answer at 605 is no, then the process proceeds to an embodiment of compression method 610 (shown in FIG. 7) for compressing non-repetitive data. More specifically, the process proceeds to method 610, where the data length n is equal to checked counter value+1. After compression method 610, the process continues at 615. At 615, the current data pointer is updated. In other words, the current data pointer is updated to point to the next byte. Thereafter, the process returns to step 510 in flowchart 500 (shown in FIG. 5).

If the answer at 605 is yes, then the process proceeds to 620 where it is determined whether the checked counter value is equal to the repeat counter value+1. If the answer at 620 is no, then the process proceeds to an embodiment of compression method 610 (shown in FIG. 7) for compressing non-repetitive data. More specifically, the process proceeds to method 610, where the data length n is equal to checked counter value— repeat counter value−1. After compression method 610, the process proceeds to an embodiment of compression method 625 (shown in FIG. 8) for compressing repetitive data. More specifically, the process proceeds to method 625 where the data length n is equal to repeat counter value+1. After compression method 625, the process proceeds to 615.

If the answer at 620 is no, then the process proceeds to an embodiment of compression method 625 (shown in FIG. 8) for compressing repetitive data. More specifically, the process proceeds to method 625 where the data length n is equal to repeat counter value+1. After compression method 625, the process proceeds to 615.

Figure 7:
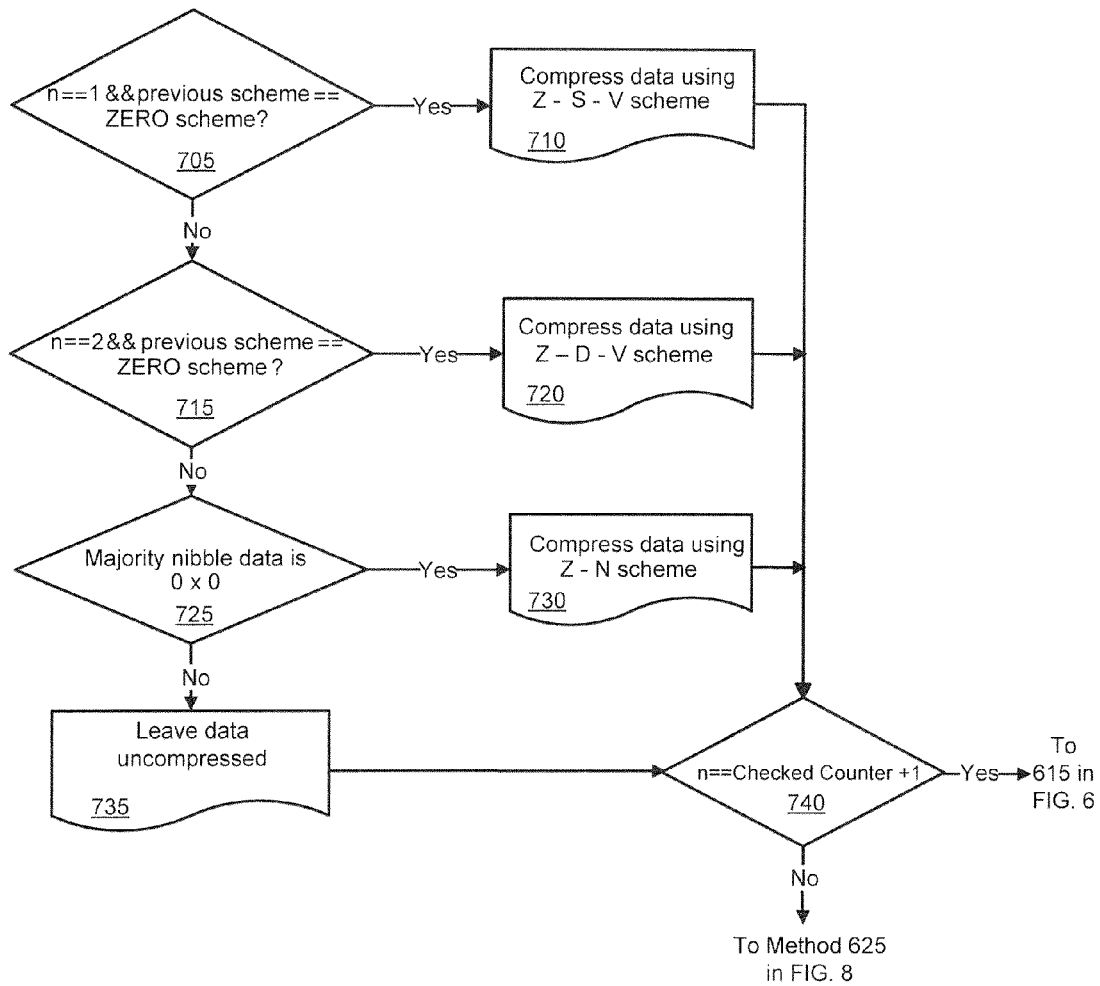
FIG. 7 is a detailed flowchart of an embodiment of a method of classifying and compressing non-repetitive data patterns.

FIG. 7 is a detailed flowchart of method 610, an embodiment of the method of classifying and compressing non-repetitive data patterns. Method 610 begins at 705 where it is determined whether n (the data length, in one embodiment in bytes) is equal to 1 and the previous scheme for compression was a ZERO scheme. If the answer at 705 is yes, then the process proceeds to 710, where the data is compressed using the Z-S-V scheme. If the answer at 705 is no, then the process proceeds to 715.

At 715, it is determined whether n is equal to 2 and the previous scheme for compression was a ZERO scheme. If the answer at 715 is yes, then the process proceeds to 720, where the data is compressed using the Z-D-V scheme. If the answer at 715 is no, then the process proceeds to 725.

At 725, it is determined whether the majority of nibbles in the data are 0x0, where 0x0 represents a nibble consisting of zeros. If the answer at 725 is yes, then the process proceeds to 730, where the data is compressed using the Z-N scheme. If the answer at 725 is no, then the process proceeds to 735. At 735, the data is left uncompressed.

From 710, 720, 730, and 735, the process proceeds to 740, where it is determined whether n is equal to checked counter value+1. If the answer at 740 is yes, then the process continues at 615 (shown in FIG. 6). If the answer at 740 is no, then the process continues at 625 (shown in FIG. 8).

Figure 8:
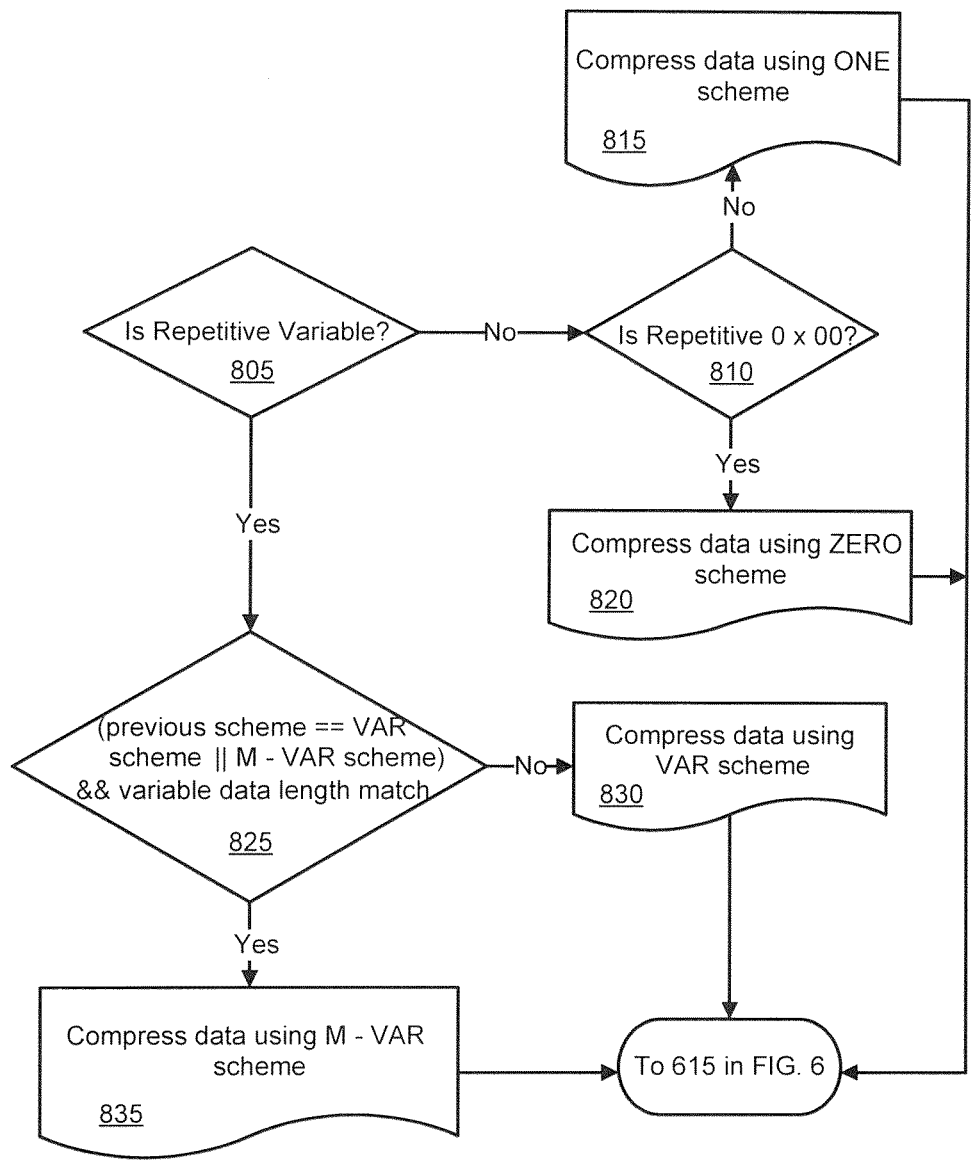
FIG. 8 is a detailed flowchart of an embodiment of a method of classifying and compressing repetitive data patterns.

FIG. 8 is a detailed flowchart of method 625, an embodiment of the method of classifying and compressing repetitive data patterns. Method 625 begins at 805, where it is determined whether a repetitive variable is found. If the answer at 805 is no, then the process proceeds to 810. At 810, it is determined whether the repetitive data is a 0x00, i.e., a byte consisting of 0s. If the answer at 810 is no, then the process proceeds to 815, where the data is compressed using the ONE scheme. If the answer at 810 is yes, then the process proceeds to 820, where the data is compressed using the ZERO scheme. If the answer at 805 is yes, then the process proceeds to 825.

At 825, it is determined whether the previous scheme was the VAR scheme or the M-VAR scheme and whether the variable data lengths for the current and previous iterations match. If the answer at 825 is no, then the process proceeds to 830, where the data is compressed using the VAR scheme. If the answer at 825 is yes, then the process proceeds to 835, where the data is compressed using the M-VAR scheme.

From 815, 820, 830, and 835, the process proceeds to 615 (shown in FIG. 6). As shown in FIG. 6, from 615, the process continues at 510 in FIG. 5.

Figure 9:
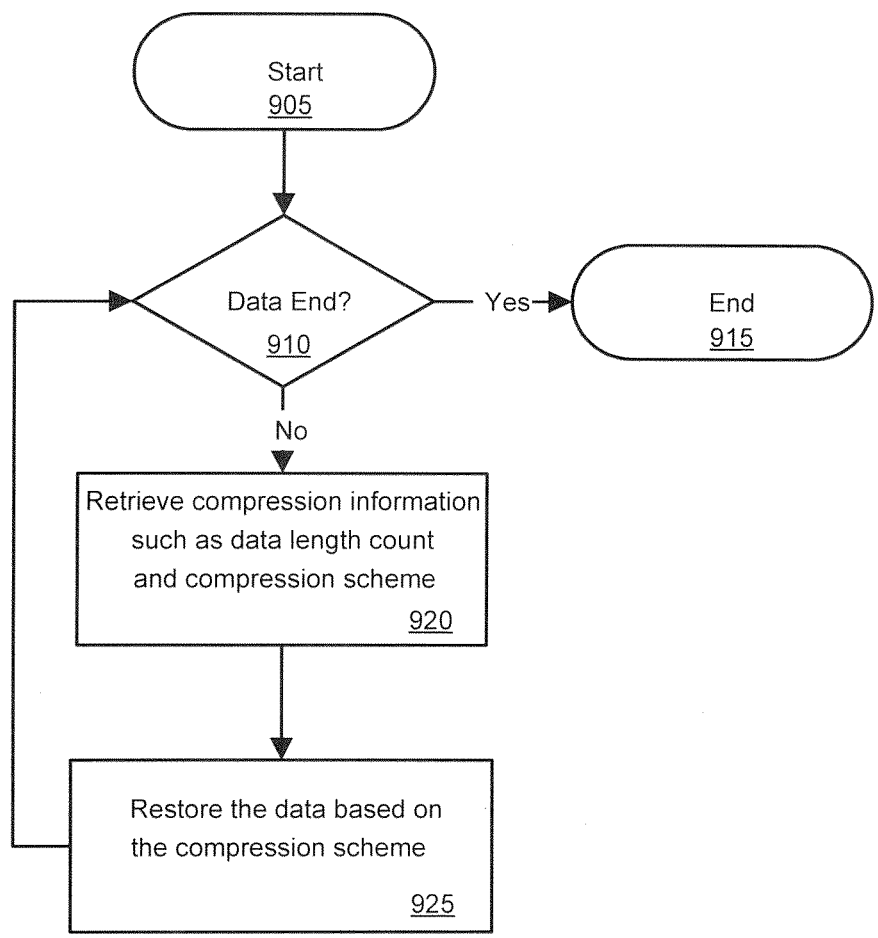
FIG. 9 is a flowchart illustrating one embodiment of a data decompression method of the present invention.

FIG. 9 is a flowchart illustrating one embodiment of a data decompression method of the present invention. Decompression method 900 starts at 905 and, in one embodiment, involves decompressing one frame of compressed data at a time, where the frames of compressed data being decompressed may be of different patterns and sizes. At 910, it is determined whether the end of the compressed data to be decompressed has been reached. In a specific embodiment, it is determined whether the last frame of compressed data that was decompressed represents the end of the compressed data. If the answer at 910 is yes, then the decompression process ends at 915. However, if the answer at 910 is no, then the decompression process proceeds to 920. At 920, the compression information (such as data length count and the compression scheme) is retrieved. In one embodiment, this information is in the header of the frame of compressed data. From 920, the process proceeds to 925, where the uncompressed data is restored based on the retrieved compression scheme.

Figure 10:
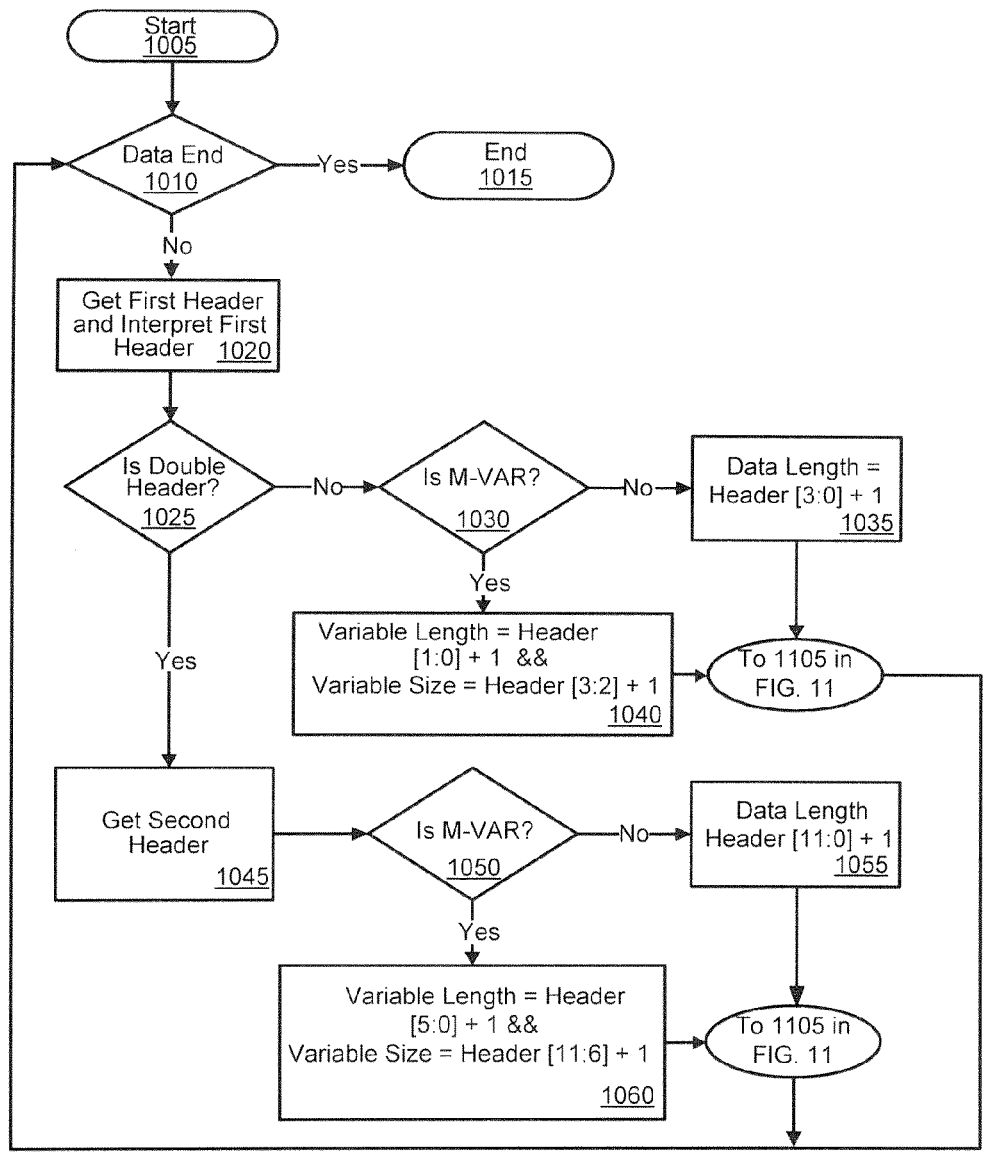
FIG. 10 is a flowchart illustrating a more detailed embodiment of the decompression method of the present invention.

FIG. 10 is a flowchart illustrating a more detailed embodiment of the decompression method of the present invention. Decompression method 1000 starts at 1005 and, in one embodiment, involves decompressing one frame of compressed data at a time, where the frames of compressed data being decompressed may be of different patterns and sizes. At 1010, it is determined whether the end of the compressed data to be decompressed has been reached. In a specific embodiment, it is determined whether the last frame of compressed data that was decompressed represents the end of the compressed data. If the answer at 1010 is yes, then the decompression process ends at 1015. However, if the answer at 1010 is no, then the decompression process proceeds to 1020.

Step 1020 involves getting the first header and interpreting it. It is to be noted that, in some embodiments, some of the header interpretation occurs in the steps after step 1020. From 1020, the process proceeds to 1025, where it is determined whether the first header is a double header. As noted above, in one embodiment, a double header is a two-byte header. In one embodiment, the header size bit of the header has a 1 bit value for a double header.

If the answer at 1025 is no, then the process proceeds to 1030. At 1030, it is determined whether the compression scheme for compressing the compressed data represented by the header frame is an M-VAR scheme. If the answer at 1030 is no, then the process proceeds to 1035. At 1035, the data length is assigned the value in Header [3:0]+1. In other words, the data length is assigned the value in bits 3 to 0 in the frame header plus 1. If the answer at 1030 is yes, then the process proceeds to 1040. At 1040, the variable length is assigned the value in Header [1:0] plus 1. In other words, the variable length is assigned the value in bits 1 to 0 in the frame header plus 1. Also, at 1040, the variable size is assigned the value in Header [3:2] plus 1. In other words, the variable size is assigned the value in bits 3 to 2 in the frame header plus 1. From both 1035 and 1040, the process proceeds to 1105 in FIG. 11.

If the answer at 1025 is yes, then the process proceeds to 1045. At 1045, the process involves getting the second header. In other words, the data for the second byte of the frame header are received. At 1050, it is determined whether the compression scheme for compressing the compressed data represented by the header frame is an M-VAR scheme. If the answer at 1050 is no, then the process proceeds to 1055. At 1055, the data length is assigned the value in Header [11:0]+1. In other words, the data length is assigned the value in bits 11 to 0 in the frame header plus 1. If the answer at 1050 is yes, then the process proceeds to 1060. At 1060, the variable length is assigned the value in Header [5:0] plus 1. In other words, the variable length is assigned the value in bits 5 to 0 in the frame header plus 1. Also, at 1060, the variable size is assigned the value in Header [11:6] plus 1. In other words, the variable size is assigned the value in bits 11 to 6 in the frame header plus 1. From both 1055 and 1060, the process proceeds to 1105 in FIG. 11.

Figure 11:
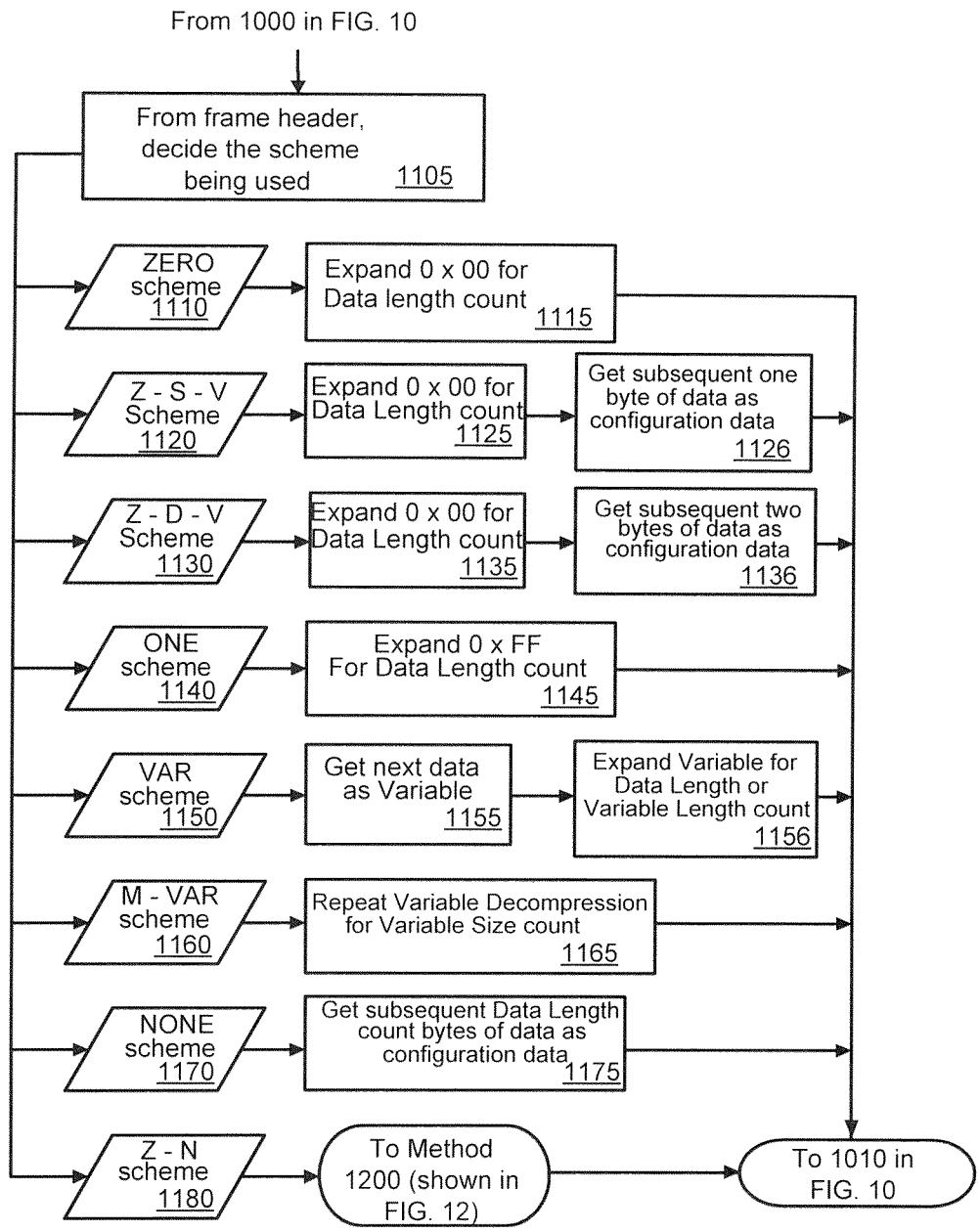
FIG. 11 is a detailed flowchart of an embodiment of restoring the data based on the compression scheme.

FIG. 11 is a detailed flowchart of an embodiment of restoring the data based on the compression scheme. More specifically, FIG. 11 is a detailed flowchart of restoring the data based on the compression scheme, i.e., step 925 in FIG. 9.

At 1105, from the frame header, the scheme used to compress the data is determined. If, at 1105, the scheme is determined to be the ZERO scheme, then the process proceeds to 1110. From 1110, the process proceeds to 1115, where the data is expanded as bytes of zeros (0x00) for the data length count.

If, at 1105, the scheme is determined to be the Z-S-V scheme, then the process proceeds to 1120. From 1120, the process proceeds to 1125, where the data is expanded as bytes of zeros (0x00) for the data length count. From 1125 the process proceeds to 1126, which involves getting the subsequent one byte of data as configuration data.

If, at 1105, the scheme is determined to be the Z-D-V scheme, then the process proceeds to 1130. From 1130, the process proceeds to 1135, where the data is expanded as bytes of zeros (0x00) for the data length count. From 1135 the process proceeds to 1136, which involves getting the subsequent two bytes of data as configuration data.

If, at 1105, the scheme is determined to be the ONE scheme, then the process proceeds to 1140. From 1140, the process proceeds to 1145, where the data is expanded as bytes of one bits (0xFF) for the data length count.

If, at 1105, the scheme is determined to be the VAR scheme, then the process proceeds to 1150. From 1150, the process proceeds to 1155, which involves getting the next data (i.e., the data after the frame header) as the variable. In other words, the variable value is assigned the next data value. From 1155, the process proceeds to 1156, which involves expanding the variable for the data length or variable length count.

If, at 1105, the scheme is determined to be the M-VAR scheme, then the process proceeds to 1160. From 1160, the process proceeds to 1165. At 1165, variable decompression is repeated for all the variables (i.e., for the variable size counts). In other words, 1165 involves performing steps 1155 and 1156 for each of the variables in the M-VAR scheme.

If, at 1105, the scheme is determined to be the NONE scheme, then the process proceeds to 1170. From 1170, the process proceeds to 1175, which involves getting subsequent data length count bytes of data as configuration data. It is to be noted that the NONE scheme indicates that the original data was uncompressed and was stored in that uncompressed form after the frame header. Thus, recovering the data simply involves getting the data stored after the frame header, i.e., getting the data in the data block.

If, at 1105, the scheme is determined to be the Z-N scheme, then the process proceeds to 1180. From 1180, the process proceeds to method 1200 (shown in FIG. 12).

From 1115, 1126, 1136, 1145, 1156, 1165, 1175 and 1200, the process continues at 1010 in FIG. 10.

Figure 12:
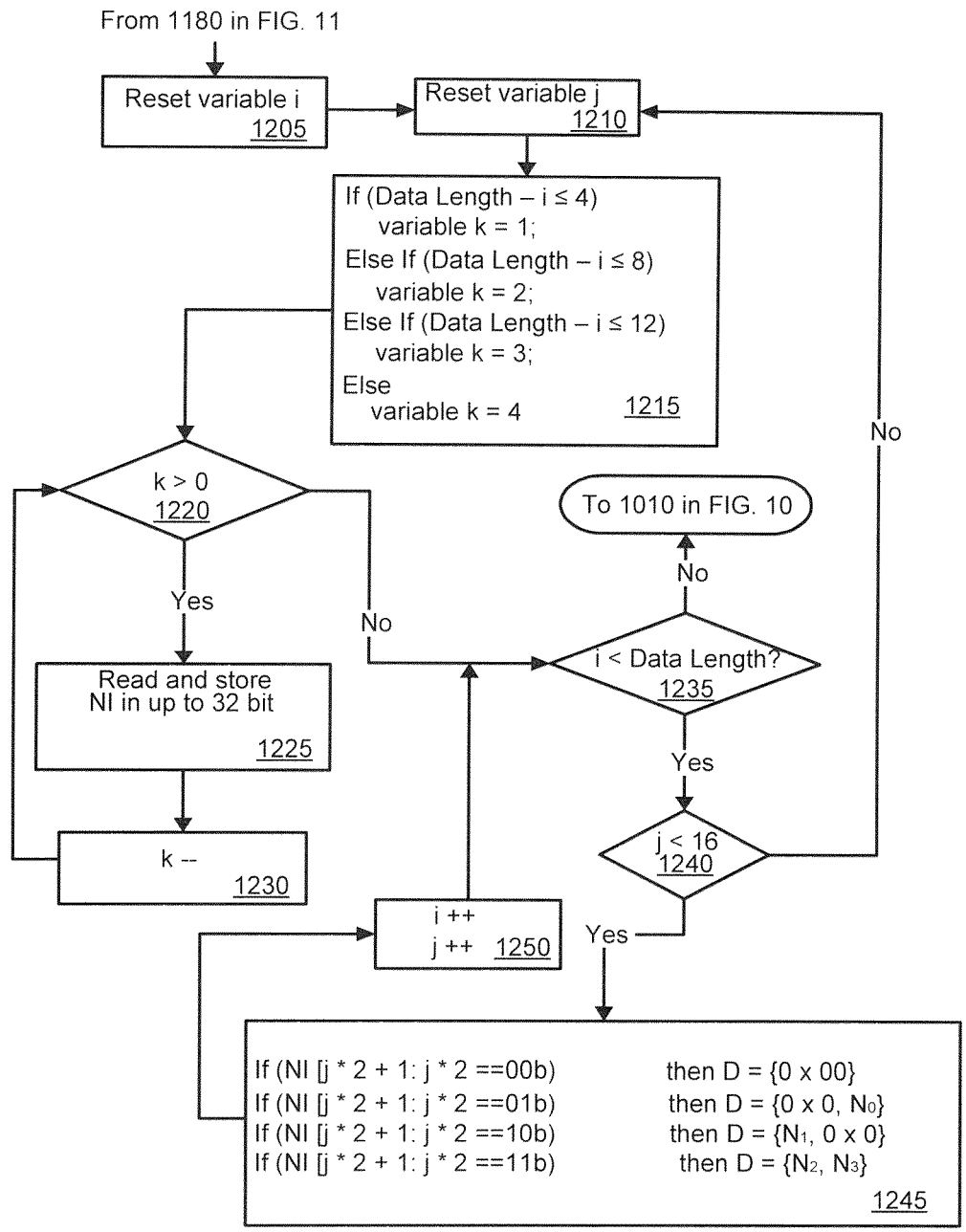
FIG. 12 is a detailed flowchart of an embodiment of decompressing data that was compressed using the Z-N compression scheme.

FIG. 12 is a detailed flowchart of an embodiment of decompressing data that was compressed using the Z-N compression scheme. Method 1200 shown in FIG. 2 starts at 1205, where the variable i is reset. The variable i is an integer used as a data length counter value (which may be referred to as the data length counter in the drawings) in bytes, where, as noted above, data length represents the length of the uncompressed data. More specifically, the variable i represents the number of data bytes (of the uncompressed data represented by a data frame) that have been processed in method 1200. In one embodiment, at 1205 the variable i is reset at 0. From 1205 the process continues at 1210, where the variable j is reset. The variable j is an integer used as a nibble byte counter value (which may be referred to as the nibble byte counter in the drawings) within one sub-frame. In one embodiment, at 1210 the variable j is reset at 0. From 1210, the process continues at 1215, where a value is determined for and assigned to variable k, which is an integer used as the NI counter value (which may be referred to as the NI counter in the drawings). At 1215, if Data Length—i is less than or equal to 4, then variable k is assigned a value of 1; else, if Data Length—i is less than or equal to 8, then variable k is assigned a value of 2; else, if Data Length—i is less than or equal to 12, then variable k is assigned a value of 3; else, variable k is assigned a value of 4. From 1215, the process continues at 1220.

At 1220, it is determined whether k is greater than 0. If the answer at 1220 is yes, then the process continues at 1225. At 1225, NI is read and stored in up to 32 bits. In one embodiment, NI is represented in 32 bits. From 1225, the process continues at 1230 where k is decremented by one. From 1230, the process returns to 1220. If the answer at 1220 is no, then the process continues at 1235.

At 1235, it is determined whether i is less than Data Length. If the answer at 1235 is no, then the process returns to 1010 in FIG. 10. On the other hand, if the answer at 1235 is yes, then the process continues at 1240.

At 1240, it is determined whether j is less than 16. If the answer at 1240 is no, then the process returns to 1210. On the other hand, if the answer at 1240 is yes, then the process continues at 1245. At 1245, the uncompressed data D for one byte is determined. At 1245, if NI at bits j*2+1 to j*2 (where * is used as a multiplication sign) is equal to 00, then D is assigned a byte of 0s. At 1245, if NI at bits j*2+1 to j*2 (where * is used as a multiplication sign) is equal to 01, then the first nibble of D is assigned 0s and the second nibble of D is assigned $N_o$ (a non-zero nibble of data from the compressed stream). At 1245, if NI at bits j*2+1 to j*2 (where * is used as a multiplication sign) is equal to 10, then the first nibble of D is assigned $N_1$ (a non-zero nibble of data from the compressed stream) and the second nibble of D is assigned 0s. At 1245, if NI at bits j*2+1 to j*2 (where * is used as a multiplication sign) is equal to 11, then the first nibble of D is assigned $N_2$ (a non-zero nibble of data from the compressed stream) and the second nibble of D is assigned $N_3$ (a non-zero nibble of data from the compressed stream).

Below is a description of the application of some parts of method 1200 to the data in the nibble-aligned group of zeros example in Table 2 above. As can be seen in Table 2, the NI in the example is 09 8A 81 68 (where 09 is the least significant byte and 68 is the most significant byte). Thus, the NI in byte format representation from NI byte 3 to NI byte 0, i.e., NI{3:0}, is {0x68, 0x81, 0x8A, 0x09}. In bit format representation from bit 31 to bit 0, NI[31:0] is [0110 1000 1000 0001 1000 1010 0000 1001]. As can be seen in Table 2, the non-zero nibble data in the compressed data are AC 93 EA C1 76. Applying step 1245 to the data, the following result is obtained. When j=0, NI[1:0]='b01 are examined, which represent 0x0A. When j=1, NI[3:2]='b10 are examined, which represent 0xC0 When j=2, NI[5:4]='b00 are examined, which represent 0x00. When j=3, NI[7:6]='b00 are examined, which represent 0x00. When j=4, NI[9:8]='b10 are examined, which represent 0x90. When j=5, NI[11:10]='b10 are examined, which represent 0x30. When j=6, NI[13:12]='b00 are examined, which represent 0x00. When j=7, NI[15:14]='b10 are examined, which represent 0xE0. When j=8, NI[17:16]='b01 are examined, which represent 0x0A. When j=9, NI[19:18]='b00 are examined, which represent 0x00. When j=10, NI[21:20]='b00 are examined, which represent 0x00. When j=11, NI[23:22]='b10 are examined, which represent 0xC0. When j=12, NI[25:24]='b00 are examined, which represent 0x00. When j=13, NI[27:26]='b10 are examined, which represent 0x10. When j=14, NI[29:28]='b10 are examined, which represent 0x70. When j=15, NI[31:30]='b01 are examined, which represent 0x06. Thus, applying method 1200 to the compressed data from the example of Table 2, the original uncompressed data (U) 0A C0 00 00 90 30 00 E0 0A 00 00 C0 00 10 70 06 of that example is recovered.

From 1245, the process continues at 1250, where i and j are both incremented by one. From 1250, the process returns to 1235 where, as noted above, it is determined whether i is less than Data Length.

Embodiments of the compression and decompression methods of the present invention are implemented using one or more computers. More specifically, in one embodiment, any one or more steps of the compression and decompression methods of the present invention are implemented using one or more computers. In one embodiment, all the steps of the compression and decompression methods of the present invention are implemented using one or more computers.

An embodiment of the invention further includes a dynamic compressor tool developed using the Qt Creator software to compress a raw programming file as well as to decompress a compressed programming file in Raw Binary Files (RBF) format. This compressor tool can, for example, be used to verify the successful implementation of embodiments of the dynamic data compression and decompression methods of the present invention.

Figure 13:
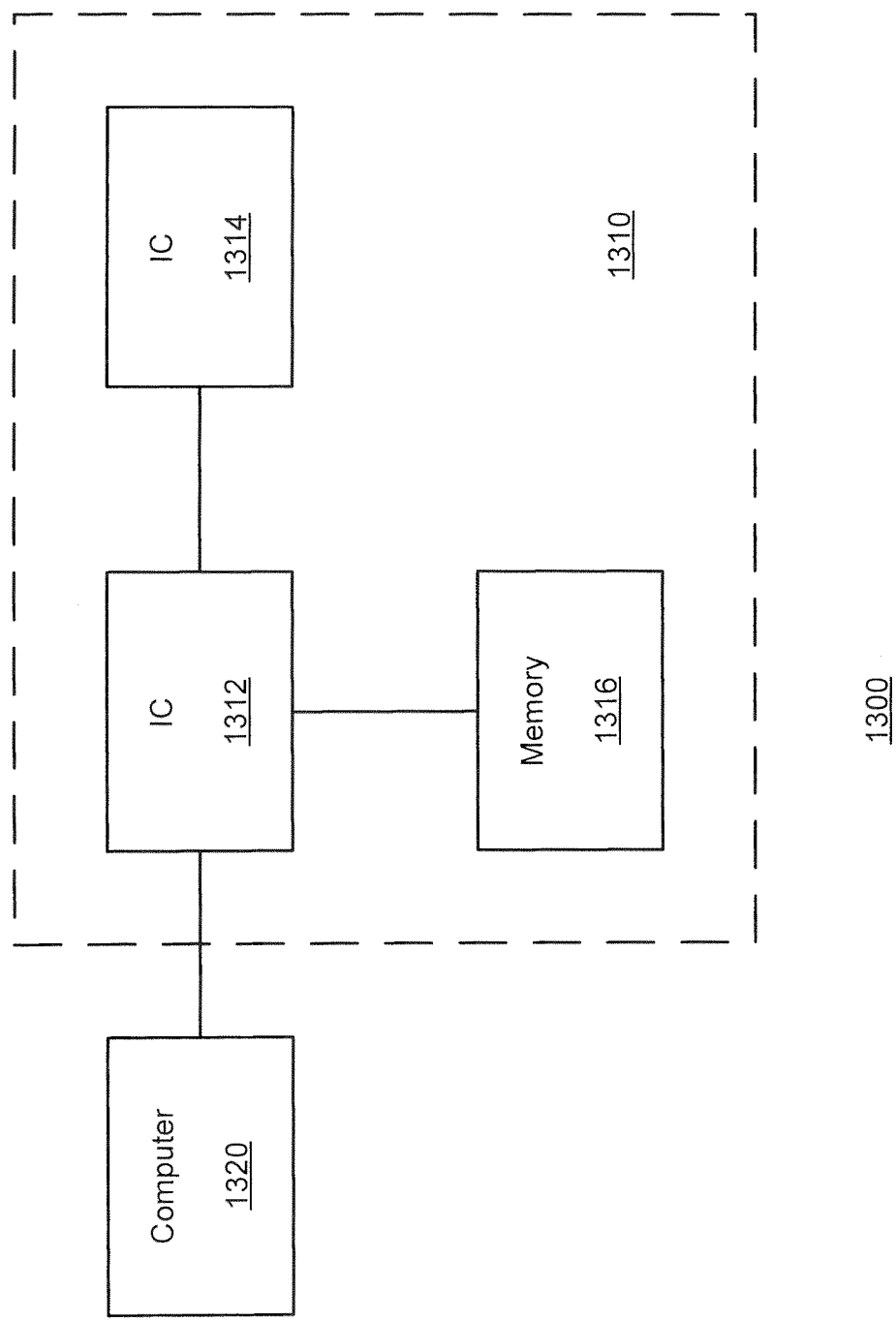
FIG. 13 illustrates a block diagram of an exemplary computer system in which embodiments of the compression and decompression methods of the present invention may be implemented and verified.

Embodiments of the dynamic data compression and decompression methods of the present invention can be implemented and verified on an IC checkout board. FIG. 13 illustrates a block diagram of an exemplary computer system in which embodiments of the compression and decompression methods of the present invention may be implemented and verified. In one embodiment, computer system 1300 includes IC board 1310 and computer 1320 coupled to the IC board 1310. IC board 1310 includes IC 1312, IC 1314 coupled to IC 1312, and memory 1316 coupled to IC 1312. In one embodiment, computer 1320 uses IC design software tools, such as electronic design automation (EDA) tools. Also in one embodiment, raw configuration data is compressed using the EDA tools on computer 1320.

In one embodiment, IC 1312 acts as a configuration controller which has been equipped with the dynamic data decompression feature implemented in the Parallel Flash Loader (PFL) megafunction. Prior to the configuration of IC 1314, memory 1316 is programmed with the compressed configuration data generated by computer 1320 using the dynamic compressor tool in the EDA tool. In one embodiment, the compressed configuration data is programmed into memory 1316 through IC 1312. More specifically, in one embodiment, the compressed configuration data is programmed into memory 1316 through a Joint Test Action Group (JTAG) interface in IC 1312.

Once memory 1316 is programmed successfully, configuration of IC 1314 is initiated. IC 1312 retrieves the compressed data stored in memory 1316, decompresses it and configures IC 1314 using the uncompressed data.

In one embodiment, IC board 1310 is a Stratix® IV (available from Altera® Corporation of San Jose, Calif.) application checkout board. Also, in one embodiment, IC 1312 is a MAX® II EPM2210 CPLD (also available from Altera® Corporation of San Jose, Calif.), IC 1314 is an EP4SGX530F1517 Stratix® IV device, the EDA tool (on computer 1320) is the Quartus® II (also available from Altera® Corporation of San Jose, Calif.), and memory 1316 is a Numonyx® 28F512P30 memory chip (available from Micron Technology®, Inc. of Boise, Id.). In such an embodiment, once the Numonyx® 28F512P30 memory chip is programmed successfully, the configuration is initiated by asserting the pfl_nreconfigure signal low using a DIP switch. This signals the Max® II to retrieve the compressed data stored in the memory, decompress it and configure the Stratix® IV in Fast Passive Parallel (FPP) configuration scheme. During the configuration, the Max® II drives the data on the DATA pin and clock on the DCLK pin of the Stratix® IV device. The Stratix® IV device latches the data on the rising edge of the DCLK and this cycle repeats until configuration completes. The completion of configuration is indicated by the Stratix IV device by releasing the CONF_DONE pin, which is then pulled high by a pull-up resistor. A low-to-high transition on CONF_DONE indicates configuration has completed and initialization of the device can begin. A successful configuration as verified on the hardware indicates a working dynamic data decompression and configuration implemented in the PFL.

Embodiments of the dynamic data compression and decompression methods of the present invention can be implemented in the IC design tool (e.g., Altera's Quartus II). In one specific embodiment, as described above, the compression and decompression method is targeted for FPP and Passive Serial (PS) configuration schemes where the decompression method is implemented in the PFL used in MAX® II device. In another embodiment, the implementation of compression and decompression method can support other configuration schemes, such as Active Serial (AS) and Active Parallel (AP) where the decompression can be performed by the IC to be configured (e.g., the FPGA to be configured).

Figure 14:
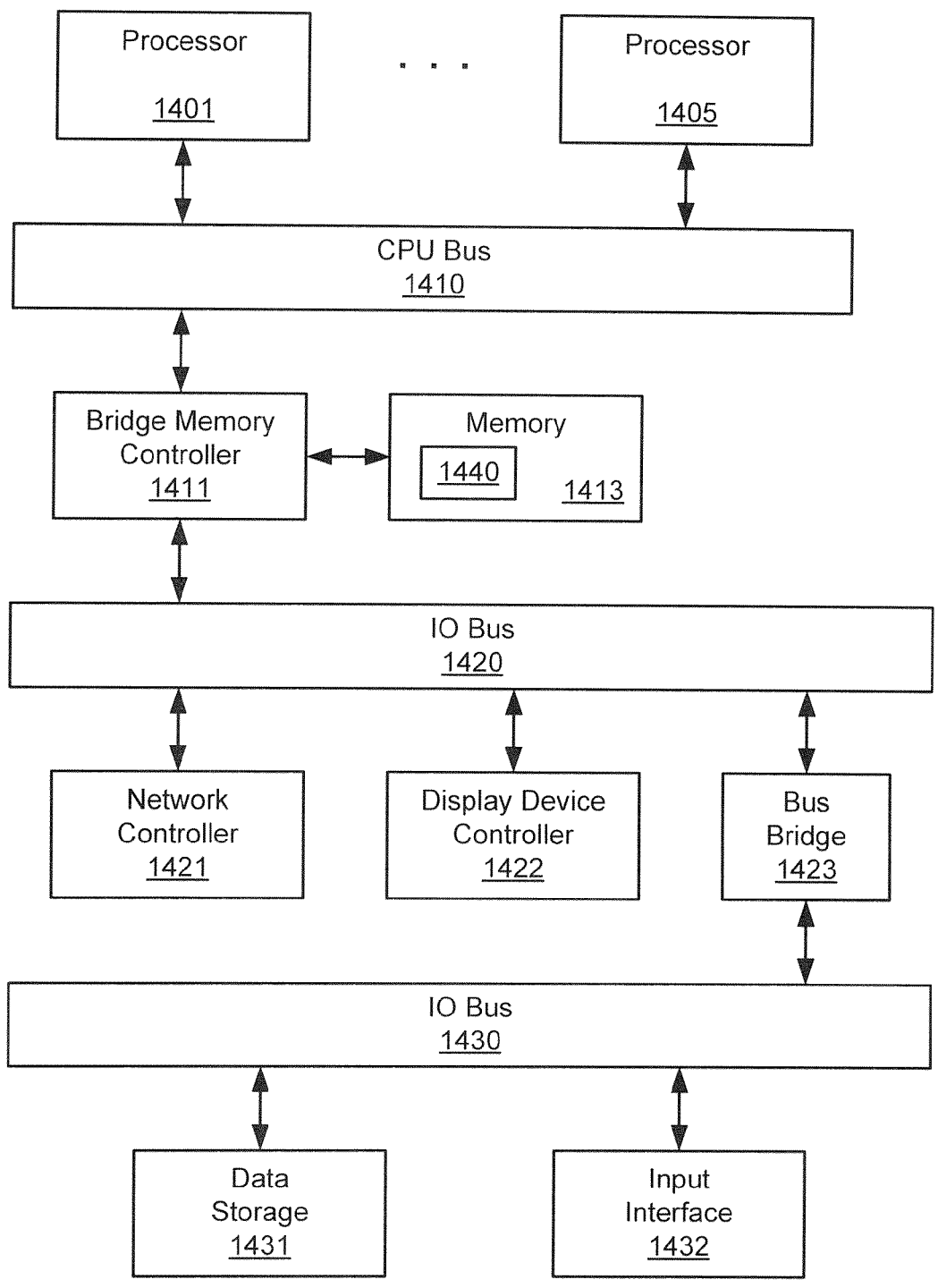
FIG. 14 is a block diagram of another exemplary computer system which may be used to perform embodiments of the methods of the present invention.

FIG. 14 is a block diagram of another exemplary computer system 1400 which may be used to perform embodiments of the methods of the present invention. Computer system 1400 includes one or more processors that process data signals. As shown, computer system 1400 includes first processor 1401 and zth processor 1405, where z may be any positive integer. Processors 1401 and 1405 may be a complex instruction set computer microprocessor, a reduced instruction set computing microprocessor, a very long instruction word microprocessor, a processor implementing a combination of instruction sets, or other processor device. Processors 1401 and 1405 may be multi-core processors with multiple processor cores on each chip. Each of processors 1401 and 1405 and each of the processor cores may support one or more hardware threads. Processors 1401 and 1405 are coupled to central processing unit (CPU) bus 1410 that transmits data signals between processors 1401 and 1405 and other components in computer system 1400.

Computer system 1400 includes memory 1413. Memory 1413 may be a dynamic random access memory (DRAM) device, a static random access memory (SRAM) device, and/or other memory device. Memory 1413 may store instructions and code represented by data signals that may be executed by processor 1401. A cache memory (not shown) may reside inside processor 1401 that stores data signals stored in memory 1413. The cache speeds access to memory by processor 1401 by taking advantage of its locality of access. In an alternate embodiment of computer system 1400, the cache resides external to processor 1401. Bridge memory controller 1411 is coupled to CPU bus 1410 and memory 1413. Bridge memory controller 1411 directs data signals between processor 1401, memory 1413, and other components in computer system 1400 and bridges the data signals between CPU bus 1410, memory 1413, and first IO bus 1420.

First IO bus 1420 may be a single bus or a combination of multiple buses. First IO bus 1420 provides communication links between components in computer system 1400. Network controller 1421 is coupled to first IO bus 1420. Network controller 1421 may link computer system 1400 to a network of computers (not shown) and supports communication among the machines. Display device controller 1422 is coupled to first IO bus 1420. Display device controller 1422 allows coupling of a display device (not shown) to computer system 1400 and acts as an interface between the display device and computer system 1400.

Second IO bus 1430 may be a single bus or a combination of multiple buses. Second IO bus 1430 provides communication links between components in computer system 1400. Data storage device 1431 is coupled to second IO bus 1430. Data storage device 1431 may be a hard disk drive, a floppy disk drive, a CD-ROM device, a flash memory device or other mass storage device. Input interface 1432 is coupled to second IO bus 1430. Input interface 1432 may be, for example, a keyboard and/or mouse controller or other input interface. Input interface 1432 may be a dedicated device or can reside in another device such as a bus controller or other controller. Input interface 1432 allows coupling of an input device to computer system 1400 and transmits data signals from an input device to computer system 1400. Bus bridge 1423 couples first IO bus 1420 to second IO bus 1430. Bus bridge 1423 operates to buffer and bridge data signals between first IO bus 1420 and second IO bus 1430. It should be appreciated that computer systems having a different architecture may also be used to implement computer system 1400.

Software 1440 for implementing embodiments of the methods of the present invention may reside in memory 1413 and be executed by one or more of processors 1401 and 1405. Embodiments of the present invention may be provided as a computer program product or software. In one embodiment, embodiments of the present invention may be provided as a machine-accessible or machine-readable medium (e.g., an electronically machine-accessible or machine-readable medium) having instructions. In one embodiment, embodiments of the present invention may be provided as an article of manufacture that includes a machine-accessible or machine-readable medium having instructions. The instructions on the machine-accessible or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing or transmitting electronic instructions. The techniques described herein are not limited to any particular software configuration. They may find applicability in any computing or processing environment. The terms "machine-accessible medium" or "machine-readable medium" used herein shall include any medium that is capable of storing, encoding, or transmitting a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In some cases, embodiments of the dynamic data compression and decompression methods of the present invention provide higher compression ratios than existing nibble compression and LZ77 compression algorithms. The memory space saving achieved using embodiments of the methods of the present invention allows the end users to use a lower density of memory, which in turn allow for lower costs and better product pricing margins. Moreover, embodiments of the dynamic data decompression support faster FPGA configuration time and help the FPGA to enter user mode in a shorter period.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A method comprising:
    identifying each portion of data as a repetitive data pattern portion or a non-repetitive data pattern portion;
    for each portion identified as a repetitive data pattern portion, identifying a repetitive compression scheme to apply to the repetitive data pattern portion;
    for each portion identified as a non-repetitive data pattern portion, identifying a non-repetitive compression scheme to apply to the non-repetitive data pattern portion; and
    compressing each data portion according to a corresponding identified compression scheme;
    wherein the identifying each portion of data, the identifying a repetitive compression scheme, the identifying a non-repetitive compression scheme, and the compressing are computer implemented, further wherein the identifying each portion of data comprises:
        for each byte of the data, determining whether that byte represents an end of the data; and
        for each byte of the data, if that byte does not represent the end of the data, resetting counter values to zeros.

2. The method of claim 1, wherein
    for each byte of the data, if that byte does not represent the end of the data,
        resetting booleans to false;
        incrementing a checked counter value; and
        determining whether a current byte is equal to a next byte.

3. The method of claim 2, wherein if the current byte is not equal to the next byte, the method further comprising:
    determining if repetitive data was found; and
    if repetitive data was not found, resetting a repeat counter value to zero.

4. The method of claim 2, wherein if the current byte is equal to the next byte, the method further comprising:
    incrementing a repeat counter value;
    determining if the current byte consists of all 1 bit values;
    if the current byte consists of all 1 bit values, indicating that a repetitive byte of all 1 bit values has been found; and
    if the current byte does not consist of all 1 bit values, determining if the repeat counter value is equal to 2.

5. The method of claim 4, wherein if repeat counter value is equal to 2, the method further comprising:
    determining if the current byte consists of all 0 bit values;
    if the current byte consists of all 0 bit values, indicating that a repetitive byte of all 0 bit values has been found; and
    if the current byte does not consist of all 0 bit values, indicating that a repetitive variable has been found.

6. The method of claim 5, wherein the compressing comprises:
    determining if repetitive data was found;
    if repetitive data was not found, compressing non-repetitive data having a data length equal to checked counter value plus one;
    if repetitive data was found:
        (i) determining if checked counter value is equal to repeat counter value plus one;
        (ii) if the checked counter value is equal to the repeat counter value plus one, compressing repetitive data having a data length equal to repeat counter value plus one; and
        (iii) if the checked counter value is not equal to the repeat counter value plus one, compressing non-repetitive data having data length equal to checked counter value minus repeat counter value minus one and compressing repetitive data having a data length equal to repeat counter value plus one; and
    updating current data pointer.

7. The method of claim 6, wherein the compressing non-repetitive data comprises:
    determining if the data length of the non-repetitive data is equal to one and if previous scheme is ZERO scheme;
    if the data length of the non-repetitive data is equal to one and the previous scheme is the ZERO scheme, compressing data using Z-S-V scheme;
    if the data length of the non-repetitive data is not equal to one or the previous scheme is not the ZERO scheme, determining if the data length is equal to two and if the previous scheme is the ZERO scheme;
    if the data length is equal to two and the previous scheme is the ZERO scheme, compressing data using Z-D-V scheme;
    if the data length is not equal to two or the previous scheme is not the ZERO scheme, determining if majority of nibble data is nibble of 0 bit values;
    if the majority of nibble data is nibble of 0 bit values, compressing data using Z-N scheme; and
    if the majority of nibble data is not nibble of 0 bit values, then not compressing the data.

8. The method of claim 6, wherein the compressing repetitive data comprises:
    determining if the repetitive data is a repetitive variable data;
    if the repetitive data is not a repetitive variable data, determining if the repetitive data consists of 0 bit values;

if the repetitive data does not consist of 0 bit values, compressing the repetitive data using ONE scheme; and
if the repetitive data consists of 0 bit values, compressing the repetitive data using ZERO scheme.

9. The method of claim 8 further comprising:
if the repetitive data is a repetitive variable data, determining if previous scheme is a VAR scheme or M-VAR scheme and if previous data length and current data length match;
if the previous scheme is a VAR scheme or M-VAR scheme and the previous data length and the current data length match, compressing the repetitive data using M-VAR scheme; and
if the previous scheme is a VAR scheme or M-VAR scheme, but the previous data length and the current data length do not match, compressing the repetitive data using a VAR scheme.

10. The method of claim 1, wherein the data is configuration data for configuring an integrated circuit (IC).

11. A non-transitory machine-readable medium comprising machine-executable instructions for:
identifying each portion of data as a repetitive data pattern portion or a non-repetitive data pattern portion;
for each portion identified as a repetitive data pattern portion, identifying a repetitive compression scheme to apply to the repetitive data pattern portion;
for each portion identified as a non-repetitive data pattern portion, identifying a non-repetitive compression scheme to apply to the non-repetitive data pattern portion; and
compressing each data portion according to a corresponding identified compression scheme;
wherein the identifying each portion of data comprises:
for each byte of the data, determining whether that byte represents an end of the data; and
for each byte of the data, if that byte does not represent the end of the data, resetting counter values to zeros.

12. The non-transitory machine-readable medium of claim 11, wherein for each byte of the data, if that byte does not represent the end of the data,
resetting booleans to false;
incrementing a checked counter value; and
determining whether a current byte is equal to a next byte.

13. The non-transitory machine-readable medium of claim 12, wherein if the current byte is not equal to the next byte, the non-transitory machine-readable medium further comprising machine-executable instructions for:
determining if repetitive data was found; and
if repetitive data was not found, resetting a repeat counter value to zero.

14. The non-transitory machine-readable medium of claim 12, wherein if the current byte is equal to the next byte, the non-transitory machine-readable medium further comprising machine-executable instructions for:
incrementing a repeat counter value;
determining if the current byte consists of all 1 bit values;
if the current byte consists of all 1 bit values, indicating that a repetitive byte of all 1 bit values has been found; and
if the current byte does not consist of all 1 bit values, determining if the repeat counter value is equal to 2.

15. The non-transitory machine-readable medium of claim 14, wherein if repeat counter value is equal to 2, the non-transitory machine-readable medium further comprising machine-executable instructions for:
determining if the current byte consists of all 0 bit values;
if the current byte consists of all 0 bit values, indicating that a repetitive byte of all 0 bit values has been found; and
if the current byte does not consist of all 0 bit values, indicating that a repetitive variable has been found.

16. The non-transitory machine-readable medium of claim 15, wherein the compressing comprises:
determining if repetitive data was found;
if repetitive data was not found, compressing non-repetitive data having a data length equal to checked counter value plus one;
if repetitive data was found:
(i) determining if checked counter value is equal to repeat counter value plus one;
(ii) if the checked counter value is equal to the repeat counter value plus one, compressing repetitive data having a data length equal to repeat counter value plus one; and
(iii) if the checked counter value is not equal to the repeat counter value plus one, compressing non-repetitive data having data length equal to checked counter value minus repeat counter value minus one and compressing repetitive data having a data length equal to repeat counter value plus one; and
updating current data pointer.

17. The non-transitory machine-readable medium of claim 16, wherein the compressing non-repetitive data comprises:
determining if the data length of the non-repetitive data is equal to one and if previous scheme is ZERO scheme;
if the data length of the non-repetitive data is equal to one and the previous scheme is the ZERO scheme, compressing data using Z-S-V scheme;
if the data length of the non-repetitive data is not equal to one or the previous scheme is not the ZERO scheme, determining if the data length is equal to two and if the previous scheme is the ZERO scheme;
if the data length is equal to two and the previous scheme is the ZERO scheme, compressing data using Z-D-V scheme;
if the data length is not equal to two or the previous scheme is not the ZERO scheme, determining if majority of nibble data is nibble of 0 bit values;
if the majority of nibble data is nibble of 0 bit values, compressing data using Z-N scheme; and
if the majority of nibble data is not nibble of 0 bit values, then not compressing the data.

18. The non-transitory machine-readable medium of claim 16, wherein the compressing repetitive data comprises:
determining if the repetitive data is a repetitive variable data;
if the repetitive data is not a repetitive variable data, determining if the repetitive data consists of 0 bit values;
if the repetitive data does not consist of 0 bit values, compressing the repetitive data using ONE scheme; and
if the repetitive data consists of 0 bit values, compressing the repetitive data using ZERO scheme.

19. The non-transitory machine-readable medium of claim 18 further comprising instructions for:
if the repetitive data is a repetitive variable data, determining if previous scheme is a VAR scheme or M-VAR scheme and if previous data length and current data length match;
if the previous scheme is a VAR scheme or M-VAR scheme and the previous data length and the current data length match, compressing the repetitive data using M-VAR scheme; and
if the previous scheme is a VAR scheme or M-VAR scheme, but the previous data length and the current data length do not match, compressing the repetitive data using a VAR scheme.

20. The non-transitory machine-readable medium of claim 11, wherein the data is configuration data for configuring an integrated circuit (IC).

* * * * *